United States Patent
Nakahara

(10) Patent No.: US 8,045,305 B2
(45) Date of Patent: Oct. 25, 2011

(54) PROTECTION CIRCUIT

(75) Inventor: Hironori Nakahara, Kyoto (JP)

(73) Assignee: Rohm Co., Ltd. (JP)

( * ) Notice: Subject to any disclaimer, the term of this patent is extended or adjusted under 35 U.S.C. 154(b) by 445 days.

(21) Appl. No.: 12/400,157

(22) Filed: Mar. 9, 2009

(65) Prior Publication Data

US 2009/0225482 A1    Sep. 10, 2009

(30) Foreign Application Priority Data

Mar. 7, 2008    (JP) .................. 2008-058526

(51) Int. Cl.
*H02H 3/22*    (2006.01)

(52) U.S. Cl. ........................................ 361/56; 361/111

(58) Field of Classification Search .............. 361/56, 361/111; 257/355–360
See application file for complete search history.

(56) References Cited

U.S. PATENT DOCUMENTS 6,317,305 B1 * 11/2001 Dedic ............................. 361/56
7,636,464 B2 * 12/2009 Kobayashi et al. ........... 382/128

FOREIGN PATENT DOCUMENTS

| JP | 11-284130 A | 10/1999 |
| JP | 2000-98338 A | 4/2000 |

* cited by examiner

*Primary Examiner* — Danny Nguyen
(74) *Attorney, Agent, or Firm* — Cantor Colburn LLP

(57) ABSTRACT

A first transistor is an N-channel MOSFET (Metal Oxide Semiconductor Field Effect Transistor) with a first terminal of the conduction channel, the gate, and the back gate thereof connected to a terminal to be protected. A second transistor is an N-channel MOSFET with a first channel of the conduction channel, the gate, and the back gate thereof connected to a fixed voltage terminal, and with a second terminal of the conduction channel thereof connected to the second terminal of the conduction channel of the first transistor. The first transistor and the second transistor are floating MOSFETs formed in a common N-type well formed in a P-type semiconductor substrate, and are provided in the form of separate devices. A common connection node which connects the first transistor and the second transistor is connected to an N-type well for device separation.

8 Claims, 3 Drawing Sheets

PROTECTION CIRCUIT

BACKGROUND OF THE INVENTION

1. Field of the Invention

The present invention relates to a protection circuit which protects a circuit from electrostatic breakdown, and particularly to a protection circuit using a MOSFET (Metal Oxide Semiconductor Field Effect Transistor).

2. Description of the Related Art

A semiconductor integrated circuit includes pads which allow signals to be input/output. If static electricity or surge noise is applied to such a pad, in some cases, it has an effect on the reliability of circuit elements included in the semiconductor integrated circuit. In order to solve such a problem, a protection circuit employing a zener diode or the like is provided for the pads.

For example, in a case in which a positive voltage signal is transmitted via a pad to be protected, a protection diode is arranged in an orientation such that the cathode thereof corresponds to the pad side and the anode thereof corresponds to the ground terminal side.

[Patent Document 1]
Japanese Patent Application Laid Open No. H11-284130
[Patent Document 2]
Japanese Patent Application Laid Open No. 2000-98338

However, in some cases, an audio signal, which is supplied to speakers or headphones, swings between the positive voltage side and the negative voltage side with the ground electric potential as the center. In a case in which the aforementioned protection diode is connected to such a terminal via which an audio signal is transmitted, when the audio signal swings into the negative voltage side, the protection diode is switched to the forward state, i.e., the ON state, leading to a problem in that the signal is clamped, or a problem in that leak current occurs. That is to say, such a protection diode cannot be applied to a terminal at which the voltage can fall below a voltage smaller than the ground voltage, and thus there is a limit to the voltage range to which such a protection diode can be applied.

SUMMARY OF THE INVENTION

The present invention has been made in order to solve such a problem. It is a general purpose of the present invention to provide a protection circuit having an increased usable voltage range.

A protection circuit according to an embodiment of the present invention includes: a first transistor which is an N-channel MOSFET (Metal Oxide Semiconductor Field Effect Transistor) in which one terminal of a conduction channel, a gate, and a back gate thereof is connected to a terminal to be protected; and a second transistor which is an N-channel MOSFET in which one terminal of a conduction channel, a gate, and a back gate thereof is connected to a fixed voltage terminal, and the other terminal of the conduction channel thereof is connected to the other terminal of the conduction channel of the first transistor. The first and second transistors are floating MOSFETs formed in a common N-type well formed in a P-type semiconductor substrate, and are provided in the form of separate devices. A common connection node which connects the first and second transistors is connected to the N-type well.

With such an embodiment, the first transistor and the second transistor provide a function as two diodes with opposing cathodes. Accordingly, in a case in which overvoltage is applied to the terminal, conduction occurs with one diode in the forward direction and with the other diode in the backward direction, thereby protecting the internal circuit. In the normal operation, in a case in which a signal is input to the protection-target terminal at a smaller electric potential than that at the fixed voltage terminal, the signal is not clamped. Thus, such an arrangement can be used for a wide voltage range.

Another embodiment of the present invention also relates to a protection circuit. The protection circuit includes: a first transistor which is a P-channel MOSFET in which one terminal of a conduction channel, a gate, and a back gate thereof is connected to a terminal to be protected; and a second transistor which is a P-channel MOSFET in which one terminal of a conduction channel, a gate, and a back gate thereof is connected to a fixed voltage terminal, and the other terminal of the conduction channel thereof is connected to the other terminal of the conduction channel of the first transistor. The first and second transistors are floating MOSFETs formed in a common P-type well formed in an N-type semiconductor substrate, and are provided in the form of separate devices. A common connection node which connects the first and second transistors is connected to the P-type well.

Also, a signal, which swings with the electric potential at the fixed voltage terminal as the center, may be transmitted via the terminal to be protected.

Also, the signal which is transmitted via the terminal to be protected may be an audio signal. Also, an electroacoustic conversion element may be connected to the terminal to be protected.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not affect the electric connection therebetween, in addition to a state in which the member A is physically and directly connected to the member B. In the same way, the state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

Figure 1:
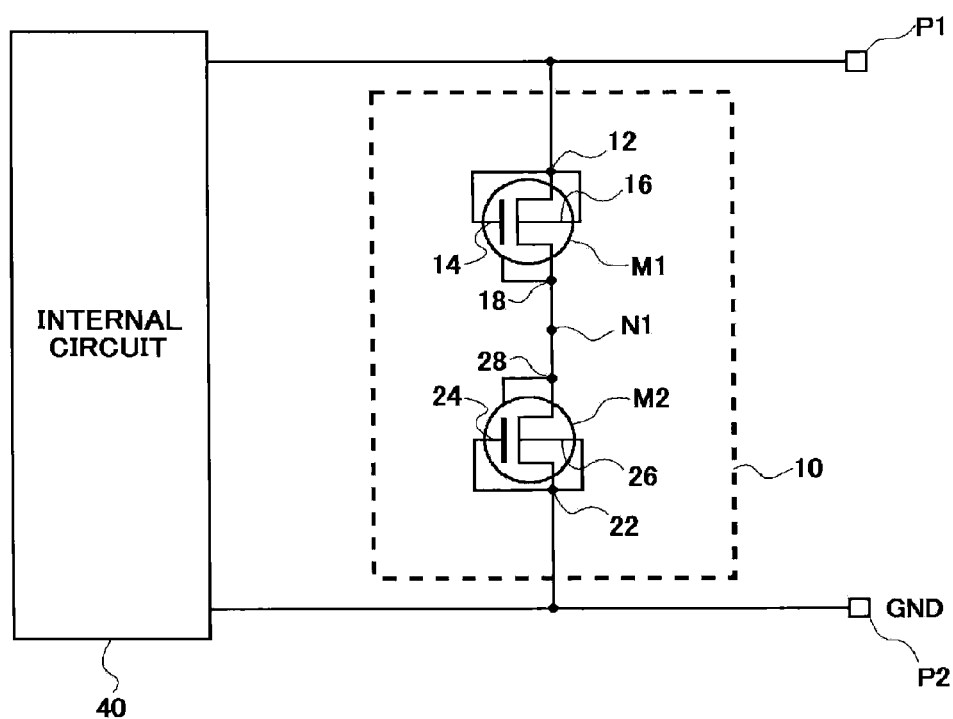
FIG. 1 is a circuit diagram which shows a configuration of a protection circuit according to an embodiment.

FIG. 1 is a circuit diagram which shows a configuration of a protection circuit 10 according to an embodiment. The protection circuit 10 is provided between an internal circuit 40 to be protected and external-connection terminals (which will also be referred to as "pads") P1 and P2. The pad P2 is grounded, and provides a function as a fixed voltage terminal. A signal output from the internal circuit 40 is output to an external circuit via the terminal P1. Alternatively, a signal received from an external circuit is input to the internal circuit 40 via the terminal P1.

The protection circuit 10 is provided in order to protect the internal circuit 40 from overvoltage in a case in which unexpected overvoltage such as electrostatic noise or a surge is applied to the terminal P1. That is to say, the terminal P1 is a terminal to be protected.

The protection circuit 10 includes a first transistor M1 and a second transistor M2. The first transistor M1 and the second transistor M2 are N-channel MOSFETS, and are connected in series between the terminal P1 and the fixed voltage terminal P2.

The first transistor M1 is arranged such that one terminal of the conduction channel (which will be referred to as the "first terminal") 12, a gate 14, and a back gate 16 are connected to the pad P1 to be protected. The second transistor M2 is arranged such that one terminal of the conduction channel (which will be referred to as the "first terminal") 22, a gate 24, and a back gate 26 are connected to the fixed voltage terminal P2. Furthermore, the other terminal (second terminal) 28 of the conduction channel of the second transistor M2 is connected to the other terminal (second terminal) of the conduction channel of the first transistor M1.

Figure 2:
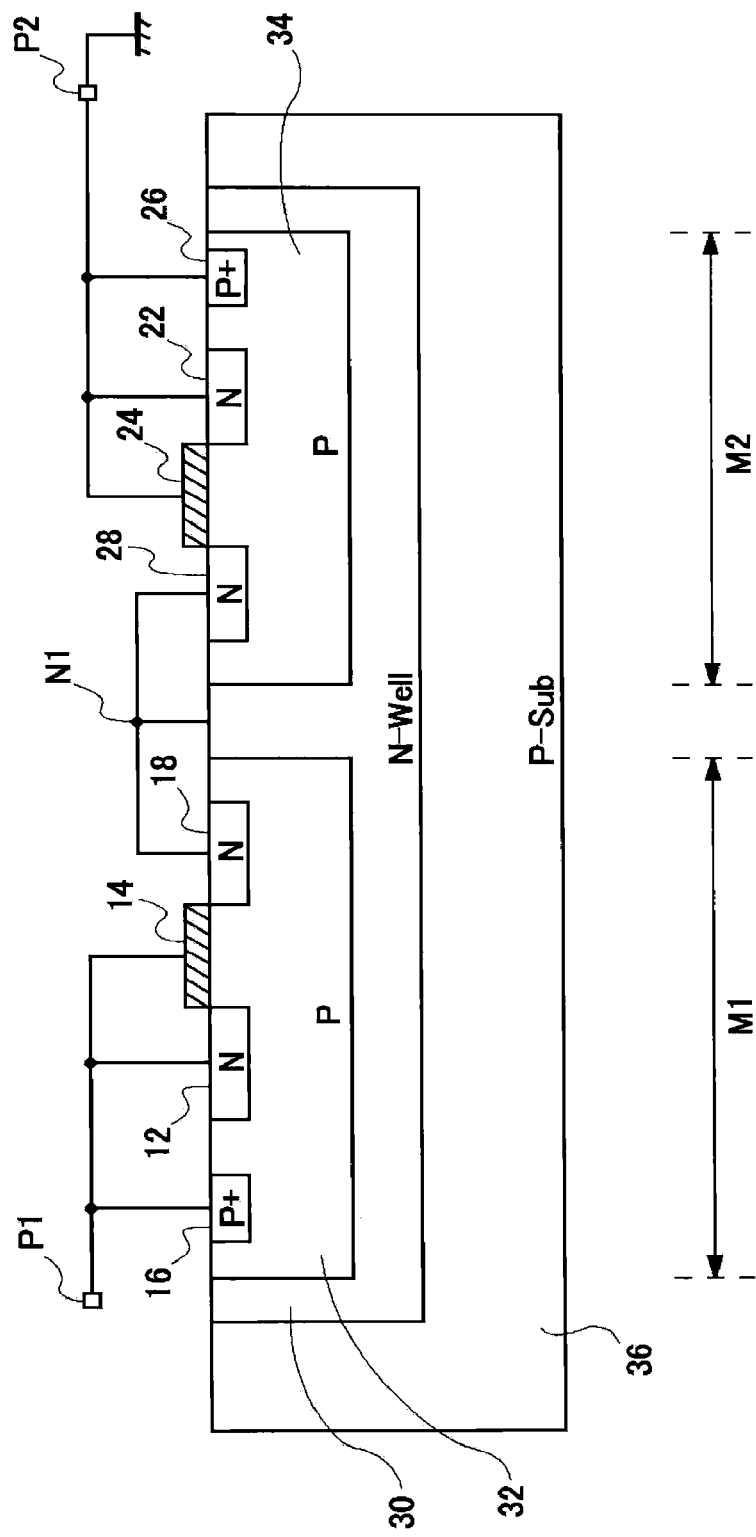
FIG. 2 is a cross-sectional view which shows a device structure of the protection circuit shown in FIG. 1.

FIG. 2 is a cross-sectional diagram which shows the device structure of the protection circuit 10 shown in FIG. 1.

The first transistor M1 and the second transistor M2 are formed on a P-type semiconductor substrate (which will be referred to as simply a "P-type substrate") 36 using a MOS process. An N-type well 30 is formed in the P-type substrate 36 in the form of a buried layer. The first transistor M1 and the second transistor M2 shown in FIG. 1 are floating MOSFETs which are formed in the common N-type well 30 in the form of separate devices.

A P-type well 32 for the first transistor M1 and a P-type well 34 for the second transistor M2 are formed adjacent to one another within the common N-type well 30. These P-type wells 32 and 34 are conduction channels of the first transistor M1 and the second transistor M2, respectively. On the P-type well 32 side, N-type regions are formed as the drain and the source of the first transistor M1, i.e., the first terminal 12 and the second terminal 18 shown in FIG. 1. A gate oxide 14 is formed between the first terminal (drain) 12 and the second terminal (source) 18.

Similarly, on the P-type well 34 side, N-type regions are formed as the drain and the source of the second transistor M2, i.e., the first terminal 22 and the second terminal 28 shown in FIG. 1. A gate oxide 24 is formed between the first terminal (drain) 22 and the second terminal (source) 28.

The second terminal 18 of the first transistor M1 and the second terminal 28 of the second transistor M2 are connected to an N-type well (buried layer) 30 such that they form a common connection node N1.

The above-described is the configuration of the protection circuit 10.

Next, description will be made regarding the operation of the protection circuit 10. Focusing attention on the first transistor M1, a body diode is formed between the back gate 16 and the second terminal 18 in an orientation such that the cathode thereof corresponds to the second terminal 18 side, and the anode thereof corresponds to the back gate 16 side. Focusing attention on the second transistor M2, a body diode is formed between the back gate 26 and the second terminal 28 in an orientation such that the cathode thereof corresponds to the second terminal 28 side, and the anode thereof corresponds to the back gate 26 side. That is to say, the two diodes are provided with opposing cathodes between the terminal P1 and the fixed voltage terminal P2.

If positive overvoltage is applied to the terminal P1, and the electric potential V1 exceeds (Vf+Vz), conduction occurs with the first transistor M1 in the forward direction and with the second transistor M2 in the backward direction. In this case, the electric potential V1 at the terminal P1 is clamped at (Vf+Vz). Here, Vf represents the forward voltage of the diode, and Vz represents the backward voltage thereof.

Furthermore, if negative overvoltage is applied to the terminal P2, and the difference in electric potential between the fixed voltage terminal P2 and the terminal P1 exceeds (Vf+Vz), conduction occurs with the second transistor M2 in the forward direction and with the first transistor M1 in the backward direction. In this case, the electric potential V2 at the terminal P2 is clamped at V1−(Vf+Vz).

Seen from another perspective, even if negative voltage is applied to the terminal P1, these diodes do not enter the conduction state as long as the difference in electric potential between the terminal P1 and the fixed voltage terminal P2 does not exceed the threshold (Vf+Vz). Thus, such an arrangement allows a signal swinging in the negative voltage range to be output from the terminal P1. Also, such an arrangement allows a signal swinging in the negative voltage range to be input to the terminal P1.

The protection circuit 10 according to the embodiment is capable of electrostatically protecting the terminal via which a negative voltage signal is transmitted. Thus, the protection circuit 10 can be suitably applied to the following kind of application.

Figure 3:
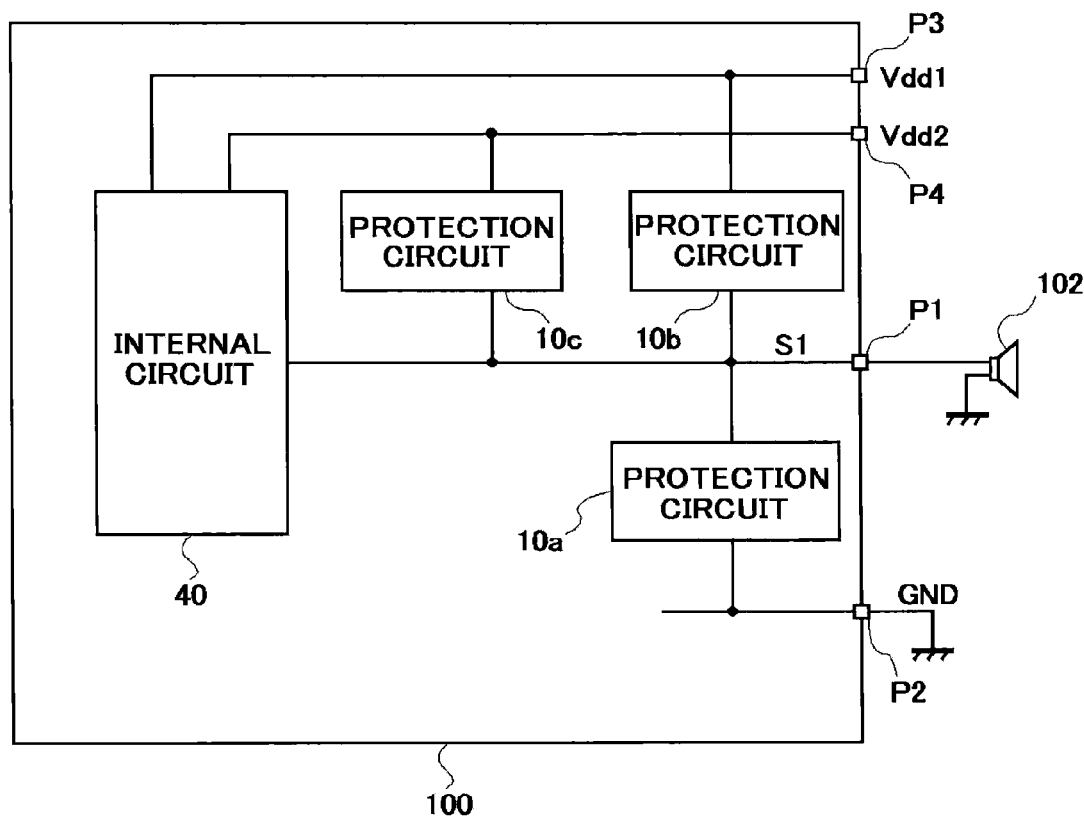
FIG. 3 is a circuit diagram which shows a configuration of a semiconductor apparatus including the protection circuit shown in FIG. 1.

FIG. 3 is a circuit diagram which shows a configuration of a semiconductor apparatus 100 including the protection circuit 10 shown in FIG. 1. The semiconductor apparatus 100 includes at least one protection circuit from among protection circuits 10a through 10c. The function of the semiconductor apparatus 100 is not restricted in particular. For example, the semiconductor apparatus 100 has a function of outputting an audio signal S1 to an electroacoustic conversion element (which will be referred to as a "speaker" hereafter) 102 such as speakers, headphones, or the like. With such an arrangement, in a case in which the speaker 102 is driven so as to output an acoustic signal, the electric potential at the terminal P1 swings with the ground potential as the center.

The semiconductor apparatus 100 includes the fixed voltage terminal P2 and multiple power supply terminals P3 and P4, in addition to the output terminal P1. The internal circuit 40 receives power supply voltages Vdd1 and Vdd2 which are supplied via the power supply terminals P3 and P4, respectively, and outputs an audio signal S1.

The audio signal S1, which swings between the positive voltage side and the negative voltage side with the ground potential as the center, is transmitted to the terminal P1. Thus, by applying the protection circuit 10 according to the embodiment, such an arrangement suitably protects the internal circuit 40 from overvoltage which can be applied to the terminal P1, without affecting the transmission of the audio signal S1.

For example, the protection circuit 10a is provided between the terminal P1 and the fixed voltage terminal P2. Furthermore, the protection circuit 10b is provided between the terminal P1 and the power supply terminal P3, and the protection circuit 10c is provided between the terminal P1 and the power supply terminal P4.

The most important component for protecting the internal circuit 40, or the component which provides the most effective protection function, is the protection circuit 10a provided between the terminal P1 and the fixed voltage terminal P2. Accordingly, in a case of giving priority to the circuit area, only the protection circuit 10 is preferably provided.

In a case of improving the voltage endurance against surge noise, etc., at least one of, and preferably both of, the protection circuits 10b and 10c should be provided between the terminal P1 and the power supply terminal P3 and between the terminal P1 and the power supply terminal P4.

The internal circuit 40 may include an amplifier which amplifies the audio signal S1. Also, the internal circuit 40 may be a simple input selector (multiplexer) which selects and outputs one from among multiple input audio signals.

Also, the internal circuit 40 may be an output selector (demultiplexer) which outputs the audio signal S1 via one selected from among multiple output terminals. In this case, a protection circuit 10 is preferably provided for each of the multiple output terminals.

The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding a modification.

Description has been made in the embodiment regarding the protection circuit 10 formed on a P-type semiconductor substrate. Also, the protection circuit 10 may be formed on an N-type semiconductor substrate. In this case, each of the first transistor M1 and the second transistor M2 is formed in the form of a P-channel MOSFET. Furthermore, in the device structure shown in FIG. 2, the P-type element should be replaced by an N-type element, and the N-type element should be replaced by a P-type element. That is to say, a protection circuit according to a modification includes: a first transistor which is a P-channel MOSFET with one terminal of the conduction channel, the gate, and the back gate thereof connected to a terminal to be protected; and a second transistor which is a P-channel MOSFET with one terminal of the conduction channel, the gate, and the back gate thereof connected to a fixed voltage terminal, and with the other terminal of the conduction channel thereof connected to the other terminal of the conduction channel of the first transistor. The first and second transistors are floating MOSFETs formed within a common P-type well formed in the N-type semiconductor substrate, and are provided in the form of separate devices. The common connection node which connects the first and second transistors is connected to a P-type well.

Such a modification also suitably protects an internal circuit without affecting the transmission of a signal.

While the preferred embodiments of the present invention have been described using specific terms, such description is for illustrative purposes only, and it is to be understood that changes and variations may be made without departing from the spirit or scope of the appended claims.

What is claimed is:

1. A protection circuit including:
   a first transistor which is an N-channel MOSFET (Metal Oxide Semiconductor Field Effect Transistor) wherein one terminal of a conduction channel, a gate, and a back gate thereof is connected to a terminal to be protected; and
   a second transistor which is an N-channel MOSFET wherein one terminal of a conduction channel, a gate, and a back gate thereof is connected to a fixed voltage terminal, and the other terminal of the conduction channel thereof is connected to the other terminal of the conduction channel of the first transistor,
   wherein the first and second transistors are floating MOSFETs formed in a common N-type well formed in a P-type semiconductor substrate, and are provided in the form of separate devices,
   and wherein a common connection node which connects the first and second transistors is connected to the N-type well.

2. A protection circuit according to claim 1, wherein a signal, which swings with the electric potential at the fixed voltage terminal as the center, is transmitted via the terminal to be protected.

3. A protection circuit according to claim 2, wherein the signal which is transmitted via the terminal to be protected is an audio signal.

4. A protection circuit according to claim 1, wherein an electroacoustic conversion element is connected to the terminal to be protected.

5. A protection circuit including:
   a first transistor which is a P-channel MOSFET wherein one terminal of a conduction channel, a gate, and a back gate thereof is connected to a terminal to be protected; and
   a second transistor which is a P-channel MOSFET wherein one terminal of a conduction channel, a gate, and a back gate thereof is connected to a fixed voltage terminal, and the other terminal of the conduction channel thereof is connected to the other terminal of the conduction channel of the first transistor,
   wherein the first and second transistors are floating MOSFETs formed in a common P-type well formed in an N-type semiconductor substrate, and are provided in the form of separate devices,
   and wherein a common connection node which connects the first and second transistors is connected to the P-type well.

6. A protection circuit according to claim 5, wherein a signal, which swings with the electric potential at the fixed voltage terminal as the center, is transmitted via the terminal to be protected.

7. A protection circuit according to claim 6, wherein the signal which is transmitted via the terminal to be protected is an audio signal.

8. A protection circuit according to claim 7, wherein an electroacoustic conversion element is connected to the terminal to be protected.

* * * * *